(12) United States Patent
Kim

(10) Patent No.: US 7,411,810 B2
(45) Date of Patent: Aug. 12, 2008

(54) ONE-TIME PROGRAMMABLE MEMORY (76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 8 days.

(21) Appl. No.: 11/669,156

(22) Filed: Jan. 30, 2007

(65) Prior Publication Data
US 2007/0133259 A1 Jun. 14, 2007

(51) Int. Cl.
G11C 11/22 (2006.01)
(52) U.S. Cl. ............... 365/145; 365/175; 365/149
(58) Field of Classification Search ........... 365/145, 365/149, 175, 105, 187
See application file for complete search history.

(56) References Cited

U.S. PATENT DOCUMENTS

| | | | |
|---|---|---|---|
| 5,691,935 A * | 11/1997 | Douglass | 365/149 |
| 5,757,693 A * | 5/1998 | Houghton et al. | 365/149 |
| 5,909,400 A * | 6/1999 | Bertin et al. | 365/187 |
| 6,351,407 B1 | 2/2002 | Candelier | |
| 6,421,293 B1 | 7/2002 | Candelier et al. | |
| 6,442,065 B1 * | 8/2002 | Hofmann et al. | 365/175 |
| 6,927,997 B2 | 8/2005 | Lee et al. | |
| 7,046,569 B2 | 5/2006 | Ito et al. | |
| 7,084,452 B2 | 8/2006 | Kim | |
| 7,102,951 B2 | 9/2006 | Paillet et al. | |
| 2003/0048655 A1 * | 3/2003 | El-Sharawy et al. | 365/149 |

* cited by examiner

Primary Examiner—Anh Phung (57) ABSTRACT

In the present invention, one-time programmable memory includes a diode as an access device and a capacitor as a storage device, the diode includes four terminals, wherein the first terminal is connected to a word line, the second terminal is connected to one plate of the capacitor, the third terminal is floating, and the fourth terminal is connected to a bit line, and the capacitor includes two electrodes, wherein one of the capacitor plate serves as a storage node which is connected to the second terminal of the diode, and another plate of the capacitor is connected to a plate line, and the plate line is asserted to programming voltage which is higher than the regular supply voltage of the decoders and data latches, in order to breakdown the insulator of the capacitor when programming, but the plate line is connected to the regular supply voltage when read. And during read, the diode also serves as a sense amplifier to detect whether the storage node is forward bias or not, and it sends binary data to a latch device wherein includes a current mirror and a feedback loop, which cuts off the current path after latching. And dummy columns generate replica delay signals which guarantee timing margin and reduce cycle time. In addition, the memory cells are formed in between the routing layers, which memory cells can be stacked over the transistor or another capacitor memory cell.

14 Claims, 6 Drawing Sheets

FIG. 1A (Prior Art)

Shockley Diode
(Hold "on/off" state)

FIG. 5A    READ "1"

FIG. 5B    READ "0"

FIG. 12

ONE-TIME PROGRAMMABLE MEMORY

FIELD OF THE INVENTION

The present invention relates to a semiconductor memory device, and more particularly, to an OTP (One-Time Programmable) memory using a diode as an access device.

BACKGROUND OF THE INVENTION

One-time programmable (OTP) memories are used in integrated circuits for a variety of applications including nonvolatile memory applications. They may be used as a single memory cell, or in arrays of memory cells to provide unique chip identifications and to set operating parameters such as clock multipliers and voltage levels for devices such as microcontrollers and microprocessors, and also high-density memory applications. They may also be used to configure, customize, and repair a chip after testing, in order to repair a controller's cache memory array. One-time programmable memories are typically implemented using charge storage, fuse, or anti-fuse approaches. Charge storage approaches have typically involved defining a bit value based on charge stored on an insulated metal-oxide semiconductor (MOS) type gate structure. Such charge storage approaches, however, are not practicable with current and deep sub-micron technologies that feature very thin gate oxide because of the high gate leakage current that prevents a long retention time of the information. And other type of OTP memory is the capacitor type, wherein oxide breakdown is used to program the capacitor type memory cells, as published, U.S. Pat. No. 7,102,951, U.S. Pat. No. 6,421,293 and U.S. Pat. No. 7,046,569.

Figure 1A:
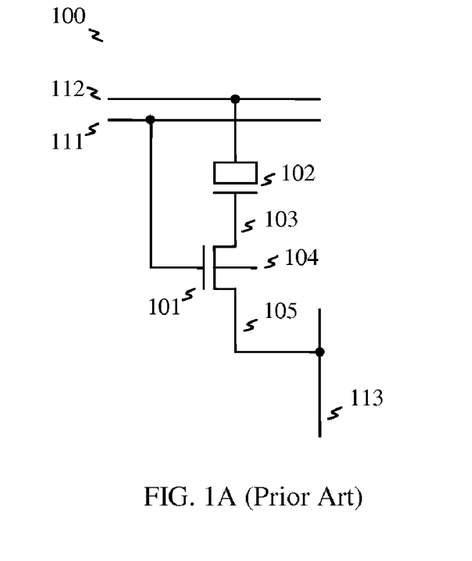
FIG. 1A depicts the schematic of the conventional one-time programmable memory including a capacitor and MOS transistor, as a prior art.

In FIG. 1A, the capacitor type OTP memory cell is illustrated, as a prior art, wherein a select line (word line) 111 is connected to the gate of MOS transistor 101, a plate line 112 is connected to one plate of a capacitor 102, the other plate 102 of the capacitor is connected to the drain 103 of the MOS transistor, the source 105 of the MOS transistor is connected a data line 113 (bit line). One of major problem of the structure is that the gate oxide of the MOS transistor 101 is damaged during high voltage program. In order to breakdown the oxide of the capacitor 102 during program, the plate line 112 is asserted to high voltage when the MOS transistor 101 is turned on. Thus, the oxide of the capacitor 102 is broken. After broken, the drain 103 is raised near plate line. At the same time, the applied voltage of the gate is also raised. Even though thick oxide is used for the gate, the high voltage may damage the MOS transistor 101 in the deep sub-micron process. In order to avoid the high voltage stress, there was an effort to add one more MOS transistor as published, U.S. Pat. No. 6,927,997. However, this structure can only reduce high voltage stress but it can not remove the high voltage stress, and also increases area.

Still there is a need to improve the access device of the OTP memory cell, and also reduce the process cost. As explained above, the conventional switching (access) devices are based on three-terminal field-effect transistor. In order to stand high voltage stress during program and also to obtain fast switching with low process cost, the MOS access device is replaced with a diode in the present invention. Four-terminal diode can be used as an access device, which includes two bipolar transistors inside. The four-terminal diode is known as Shockley diode or thyristor, is a solid-state semiconductor device similar to two-terminal p-n diode, with an extra terminal which is used to turn it on. Once turned on, diode (p-n-p-n diode or n-p-n-p diode) will remain on conducting state as long as there is a significant current flowing through it. If the current falls to zero, the device switches off. Diode has four layers, with each layer consisting of an alternately p-type or n-type material, for example p-n-p-n and n-p-n-p. The main terminals, labeled anode and cathode, are across the full four layers, and the control terminal, called the gate, is attached to one of the middle layers. The operation of a diode can be understood in terms of a pair of tightly coupled transistors, arranged to cause the self-latching action.

Diodes are mainly used where high currents and voltages are involved, and are often used to control alternating currents, where the change of polarity of the current causes the device to automatically switch off; referred to as 'zero cross operation'. The device can also be said to be in synchronous operation as, once the device is open, it conducts in phase with the voltage applied over its anode to cathode junction. This is not to be confused with symmetrical operation, as the output is unidirectional, flowing only from anode to cathode, and so is asymmetrical in nature. These properties are used control the desired load regulation by adjusting the frequency of the trigger signal at the gate. The load regulation possible is broad as semiconductor based devices are capable of switching at extremely high speeds over extremely large numbers of switching cycles.

Figure 1B:
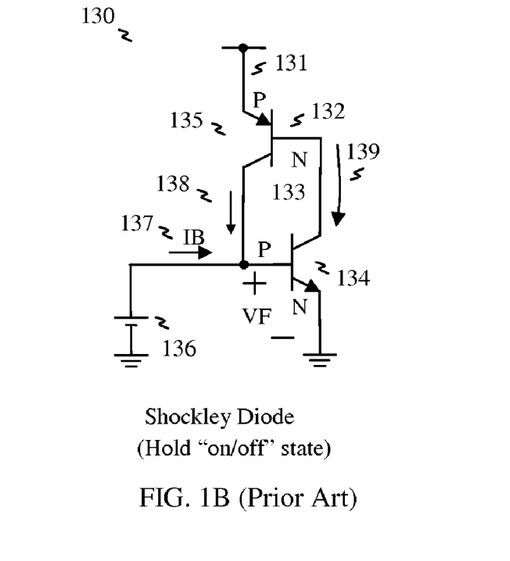
FIG. 1B illustrates a p-n-p-n diode as a prior art.

In FIG. 1B, the schematic of p-n-p-n diode is illustrated. It consists of four terminals, such that the anode 131 is connected to power supply or regulating node, the base 132 of p-n-p transistor 135 serves as the collector 132 of n-p-n transistor 134, the collector 133 of p-n-p transistor 135 serves as the base of n-p-n transistor 134 which is controlled by the voltage controller 136. In order to turn on diode and hold the state of turn-on, the voltage controller should raise the voltage from ground level to VF (forward bias, 0.6 v~0.8 v for silicon). And the voltage controller 136 should supply the current 137, referred as the base current, which current depends on the characteristic of transistor 134 and 135. Once the base current 137 establishes the forward bias (VF), the collector 132 of n-p-n transistor 134 holds the current path 139 from the base of p-n-p transistor 135. After then, p-n-p transistor 135 is turned on because the base 132 has forward bias from the emitter 131. This sets up the current path 138 which can keep the turn-on state. This is the holding state as long as the base has not so much leakage to drive the base voltage under forward bias (VF) even though the voltage controller 136 is open. To turn off diode, the voltage controller 136 should lower the voltage of the base of n-p-n transistor 134 under forward bias. To do so, the voltage controller 136 should (negatively) flow more current than the current path 138.

In the present invention, four-terminal diode replaces the MOS (Metal-Oxide Semiconductor) field-effect transistor as a switching element. However four-terminal diode can not easily replace the MOS transistor as a switching device because it has unidirectional current control characteristic and internal feedback loop. Now the present invention devotes to replace a MOS transistor with four-terminal diode and sophisticated circuit techniques are introduce to control the diode for the one-time programmable memory. The four-terminal diode can work for the one-time programmable memory as a switching device. It gives as many as advantages to design and fabricate on the wafer.

In the conventional MOS field-effect transistor, there is a parasitic bipolar transistor, as shown in FIG. 1A, wherein the base 104 controls the collector/emitter 103 and 105, and the base 104 serves as a body of the MOS transistor 101. The parasitic bipolar transistor is not wanted device in the conventional MOS transistor which is usually turned off, but now adding one more terminal to the parasitic bipolar transistor, a p-n-p-n diode (or n-p-n-p) can serve as a switching device for the next generation memory.

SUMMARY OF THE INVENTION

In the present invention, one-time programmable memory is realized, wherein the memory cell includes a diode as an access device and a capacitor as a storage element, which combination is less complicated to fabricate with additional process steps in the current CMOS process environment, compared to fabricating the conventional memory including the MOS transistor as an access device. And the memory cell is formed from deposited polysilicon on the wafer in order to reduce chip area. And also the memory cell can be formed on the MOS transistor, when low temperature polysilicon (LTPS) is used for forming the diode. LTPS has been developed for glass substrate such as liquid crystal display, around 500 Celsius degree. Now the diode access device can be formed from LTPS. Thus, topping the memory cells is independent of the MOS transistor process, which is more flexible to fabricate the memory chip.

In order to program, the diode is turned on. Thus the capacitor oxide is broken down when the plate line is raised to high (program) voltage, because the diode sets up a current path and lowers the voltage of the storage node. Hence the high voltage is applied between the storage node and the plate line. Otherwise, the diode is turned off, thus the storage node is floating, which sets up a reverse bias. The storage node is coupled to the plate line, thus the oxide of the capacitor is not broken, because only low voltage is applied between the storage node and the plate line. When the storage node is raised near the plate line voltage, one of the diode nodes is strongly reverse biased. However, the reverse bias does not breakdown the diode, and the reverse bias breakdown of the diode is generally very high.

Diode need not be a high performance device nor have a high current gain, and the diode also serves as a sense amplifier to detect the voltage of the storage node whether it is forward bias or not, then the diode sends binary results to the bit line, and the latch device including the current mirror receives the binary results from the bit line, on or off. The current mirror repeats the amount of current that the memory cell flows, and latches the result. After latching data, the output of the latch device cuts off the current path of the bit line, which reduces active current, and minimizes data pattern sensitivity. And the diode-based memory realizes fast access time, and does not require reference bit line. In addition, the diode can flow more current than MOS transistor, because the current path of the diode includes its whole junction area while the current path of MOS transistor includes the shallow inversion layer on the surface by the electric field. Furthermore, dummy columns generate replica delay signals which guarantee internal timing margin and reduce operation cycle time.

Furthermore, the oxide thickness of the capacitor can be determined for the optimum program condition regardless of the MOS transistor process, because the diode can stand higher voltage during program. The storage node is not directly connected to the MOS transistor, which prevents damage to the MOS access transistor when the plate line is asserted to high voltage.

Furthermore, there is almost no standby current in the memory cell because all the diode access devices are turned off with reverse bias, which realizes low power consumption.

However the operation of diode is not as simple as that of MOS access transistor because it has unidirectional current control characteristic and internal feedback loop, even though it has almost no parasitic effects. In the present invention, sophisticated circuit techniques are introduced to use a diode as an access device for the one-time programmable memory.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Detailed descriptions for the present invention are described as follows, which include the schematics, the timings and cross sectional views.

Figure 2:
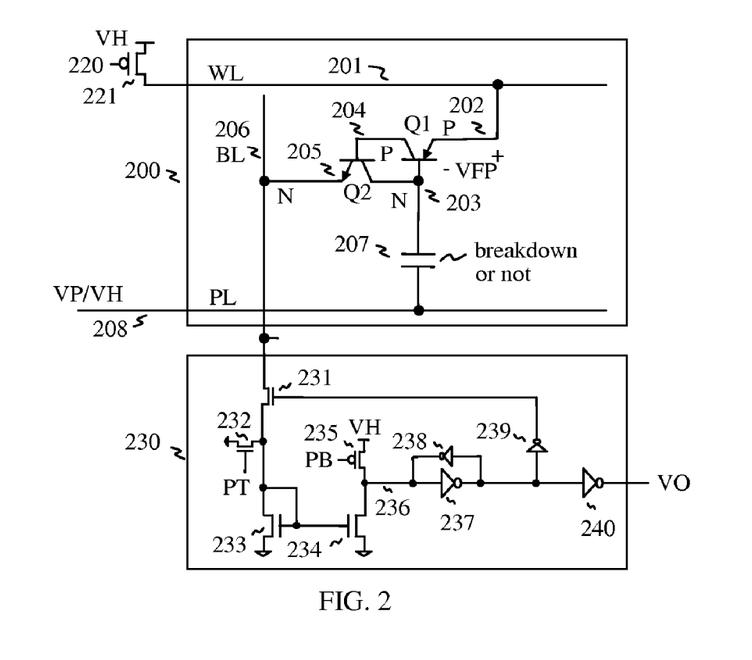
FIG. 2 illustrates the basic schematics of the one-time programmable memory and data latch, as the present invention.

In FIG. 2A, the one-time programmable memory is illustrated as the present invention, wherein a capacitor 207 stores data, such that the oxide of capacitor can be broken and shorted when programmed with high voltage, or open when un-programmed, and four-terminal diode serves as an access device instead of MOS transistor, the first terminal 202 is p-type and connected to a word line (WL) 201 to activate the memory cell, the second terminal 203 is n-type and connected to one electrode of the capacitor 207 which serves as a storage node, the third terminal 204 is p-type and floating, the fourth terminal 205 is n-type and connected to a bit line 206 to write or read data, and a plate line (PL) 208 is connected to another electrode of the capacitor 207. Unlike MOS access device, the diode is turned on or off, depending on the stored data during read cycle, which is quite different from the conventional switching concept to access the memory cell, such that the diode access device is turned on only if the storage node 203 is near ground when un-programmed. In contrast, the conventional MOS access device is turned on by the inversion layer (not shown), regardless of the stored data.

In order to read data "0" from the storage node 203 when the cell is un-programmed, the word line 201 is raised from ground level by the pull-up PMOS 221 of the word line driver, when row decoder signal 220 is asserted to ground level, wherein the supply voltage of the word line driver 221 is VH level. And the data latch 230 is powered by VH level. When the word line 201 is reached to VFP level (built-in voltage of p-n-p transistor Q1), p-n-p transistor Q1 is turned on if the storage node voltage 203 is near ground level, where the oxide of the capacitor is not broken. By turning on p-n-p transistor Q1, the collector 204 (floating node) of p-n-p transistor Q1 is raised and reached near the word line voltage from ground level. At the same time, n-p-n transistor Q2 is turned on, because the collector 204 of p-n-p transistor Q1 serves as the base 204 of n-p-n transistor Q2. Turning on p-n-p transistor Q1 and n-p-n transistor Q2, the emitter 205 of n-p-n transistor is raised by the current. Thus the bit line 206 is raised from ground level, where the initial voltage of the bit line 206 is set to ground level by NMOS 232 with pre-charge true (PT) signal. After initializing, pre-charge true (PT) signal is lowered to ground level. When the bit line 206 is reached to the threshold voltage (VTN) of the pull-down NMOS 233, pull-down device 233 is turned on, when the switch 231 is turned on by the inverter 239 which is driven by the latch node 236, where the latch node 236 is set by pre-charge-bar (PB) signal. As a result, a current path is set up from the word line 201 to the bit line 206, which is read "0" operation for the one-time programmable memory. Hence, the word line 201 indirectly turns on n-p-n Q2 through p-n-p Q1. In other words, diode access device detects whether the storage node is at forward bias or not. In this manner, the diode access device serves as a sense amplifier when read. After the current path is set up, the word line voltage is determined by the result of the voltage dividing among the elements, the pull-down NMOS 233, the four-terminal diode, pull-up PMOS 221, and routing resistance.

As a result, the word line voltage is near the sum of the bit line voltage and built-in voltage of the diode because the pull-down NMOS 233 has low resistance with common gate-drain connection like diode connection, which determines the bit line voltage, and four-terminal diode (including p-n-p Q1 and n-p-n Q2) has lower resistance, where the pull-up PMOS 221 has high resistance at linear region, and routing resistance is negligible. After then, the current mirror 234 repeats the amount of the bit line current, where the current value can be controlled by the channel width, length, and multiple mirrors. By the current mirror, the pre-charged node 236 is discharged from pre-charged voltage to ground, where the latch node 236 is pre-charged by the PMOS 235 when pre-charge bar (PB) signal is at ground level during standby. After pre-charging, PB signal is de-asserted before the word line is asserted. Hence, the voltage output (VO) of the inverter 240 through the inverter 237 is changed from VH level (high level of the memory array) to VL level (ground level), and transferred to next stage (not shown). After latching the stored data, feed-back inverter 238 and inverter 237 keeps the stored data. Simultaneously, the switch 231 is turned off by the inverter 239 (at ground level), thus the data latch cuts off the current path of the bit line after read data "0", in order to reduce the active current.

After transferring voltage output VO, the word line 201 is de-asserted to VL level to finish the read cycle. By lowering the word line 201 to VL level, the collector 204 of p-n-p Q1 (also the base 204 of n-p-n Q2) is discharged by the word line 201, but the word line can not fully discharge the collector 204 because p-n-p Q1 is turned off when the collector 204 is reached around built-in voltage VFP. The remained charges are swept by the forward bias (from p-type region 204) to n-type region 205 because the word line does not provide positive charges after de-asserted to VL level and the forward bias leakage current sweeps the remained positive charges. As a result, the diode access device can fully cut off the current path during standby or unselected after the word line is de-asserted to VL level. In doing so, the unselected cell does not generate any interference or noise when read and write data. Furthermore, the read operation is nondestructive because the storage node 203 is not changed after read. And also the un-broken oxide of the capacitor keeps the storage node voltage near ground level by the leakage of the diode.

In order to read data "1" when the oxide is broken and shorted to the plate line 208 during program, the word line 201 is asserted, but p-n-p Q1 is not turned on where the storage node 203 is reverse-biased from the word line 201 when the storage node voltage is shorted to the plate line 208 at VH level during read. Hence, read data "1" is quite different from read data "0". Neither the forward bias is established nor the current path be set up. In doing so, p-n-p Q1 and n-p-n Q2 are turned off. The storage node voltage is not changed, and the bit line voltage is not changed either. And the pre-charged node 236 is not changed because the current mirror 234 does not flow any current. Hence, output VO keeps VH level with the pre-charged voltage. Neither the latch device require the reference voltage nor wait long discharging time of the bit line, while the conventional comparator type sense amplifier requires the reference voltage to compare, and waits the bit line to be discharged enough voltage because the MOS transistor is very slow with shallow inversion layer.

Figure 3A:
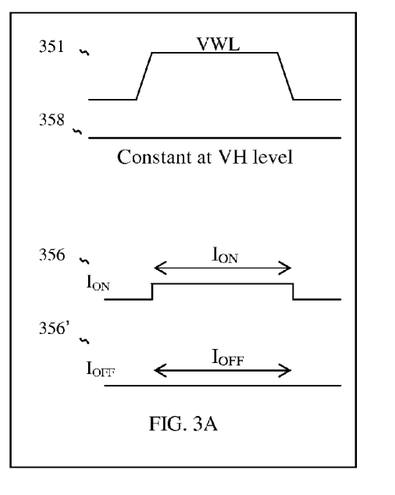
FIG. 3A illustrates a timing diagram when the word line is asserted, according to the teachings of the present invention.

Referring now to FIG. 3A in view of FIG. 2A, a timing diagram is illustrated when the word line is asserted, where the plate line 358 is constant voltage at VH level to couple the capacitor. By raising the word line 351, the current path 356 ($I_{ON}$) is set up, wherein the stored data is "0" during read cycle. Otherwise, there is no current flow ($I_{OFF}$) as shown 356' when the stored node is shorted to the plate line with oxide breakdown. And in FIG. 3B, I-V curve of the memory cell is depicted. When reading data "0", $I_{ON}$ current flows during read cycle. Thus, the word line voltage (VWL) is determined by three elements, such as the gate voltage (VGS) of pull-down NMOS device (233 in FIG. 2A), the collector-emitter voltage (VCE) of n-p-n Q2 in FIG. 2A and the base-emitter voltage (VBE) of p-n-p Q1 in FIG. 2A. Once the diode is turned on when reading data "0", the current path is sustained by the feedback loop, which also sustains the word line voltage (VWL). On the contrary, when reading data "1", the diode does not flow any current, except $I_{OFF}$ current (reverse bias leakage). And during standby, the word line is de-asserted to ground level by the row decoder (not shown), which does not flow any current.

Figure 3B:
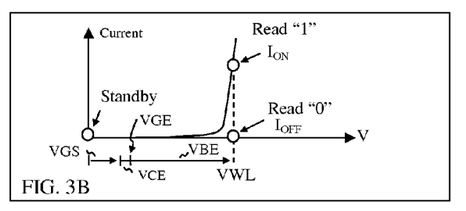
FIG. 3B illustrates I-V curve of the memory cell, according to the teachings of the present invention.
Figure 3C:
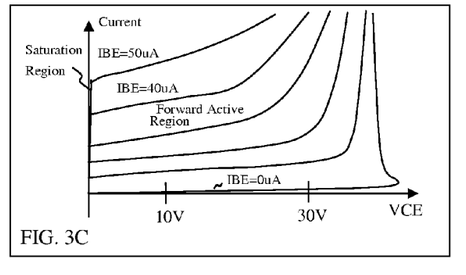
FIG. 3C illustrates I-V curve of conventional bipolar transistor is illustrated as a reference.

In FIG. 3C, I-V curve of conventional bipolar transistor is illustrated as a reference. The bipolar transistor's usefulness may be terminated as the collector voltage is increased, which is called "punch-through" or "reach-through" as described in the reference, "Microelectronics: Digital and Analog Circuits and Systems", pp. 83, Jacob Millman, Ph. D. 1979 MacGraw-Hill, Inc. ISBN 0-07-042327-X, where punch-through is occurred when the base-collector voltage reaches a certain (device specific) value, the base-collector depletion region boundary meets the base-emitter depletion region boundary. When in this state the transistor effectively has no base. The device thus loses all gain when in this state. Thus, punch-through should be avoided having enough base area, or reducing the collector-emitter voltage. In the present invention, punch-through is simply avoided by selecting wide base region or reducing the collector-emitter voltage.

Figure 4A:
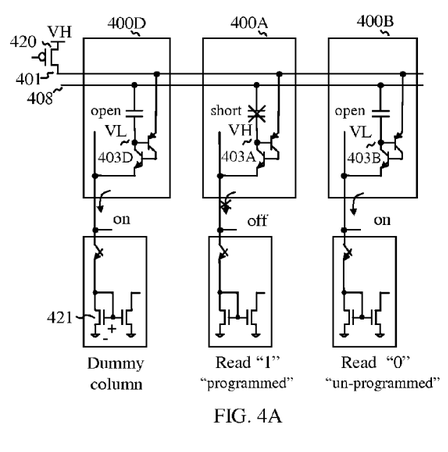
FIG. 4A illustrates more detailed read path, according to the teachings of the present invention.

In FIG. 4A, more detailed read path is illustrated as the present invention. In the memory array, multiple memory cells are connected to a word line 401 and a plate line 408, such that the memory cell 400A stores data "1" (programmed) in the storage node 403A, the memory cell 400B stores data "0" (not programmed) in the storage node 403B, and dummy cell 400D stores data "0" in the storage node 403D. When read, at least one memory cell is tuned on, in order to sustain almost same voltage of the word line regardless of the data pattern. In doing so, single or multiple dummy columns are added to limit the word line voltage under VH level, as explained in FIG. 3B. Without dummy cell, the word line voltage can be reached to VH level through pull-up PMOS 420 which is part of word line driver (row decoder), when all the stored data are "1" because all the memory cells are turned off. In order to apply strong reverse bias to the storage node, the word line voltage is sustained lower than VH level by turning on at least a dummy column, and the current flows through the pull-down NMOS 421.

Figure 4B:
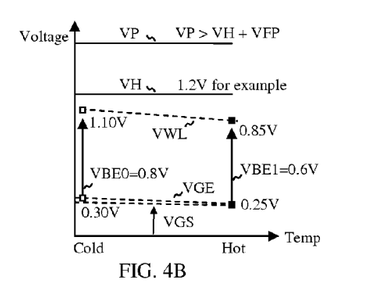
FIG. 4B illustrates the relationship between voltage and temperature of the memory cell, according to the teachings of the present invention.
Figure 4C:
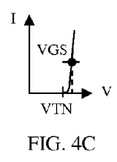
FIG. 4C illustrates I-V curve of pull-down NMOS transistor, according to the teachings of the present invention.
Figure 4D:
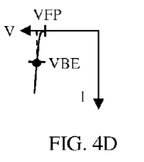
FIG. 4D illustrates I-V curve of the diode access device, according to the teachings of the present invention.
Figure 4E:
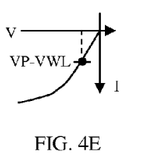
FIG. 4E illustrates I-V curve of pull-up PMOS of row decoder, according to the teachings of the present invention.

Thus, the word line voltage is determined (as VWL in FIG. 4B), such that the word line voltage is the sum of three elements, such as VGS (the gate voltage of pull-down NMOS 233 in FIG. 2A), VCE (the collector-emitter voltage of n-p-n Q2 in FIG. 2A), and VBE (the base-emitter voltage of p-n-p Q1 in FIG. 2A), where VGS is 0.25~0.3V range in recent MOS transistor, VCE is lower than 0.1 v which is ignorable with strong bipolar gain, and VBE is 0.6~0.8V for silicon, for example. In addition, the voltages depend on the ratio among the resistances of three elements. Moreover, the word line voltage depends on temperature, because threshold voltage of MOS transistor and built-in voltage of p-n-p transistor are decreased as temperature is increasing. As shown example in FIG. 4B, the word line voltage VWL is 1.1V at 0° C. As temperature is increasing, the word line voltage is decreased to 0.85V at 100° C. More detailed current-voltage curves are illustrated in FIG. 4C, 4D and 4E. The I-V curve of pull-down NMOS transistor is shown in FIG. 4C, wherein the threshold voltage of NMOS transistor is VTN, and the applied voltage of the transistor is VGS, where VGS level is determined by the current flow including pull-down NMOS, p-n-p-n diode and pull-up PMOS. Thus, VGS level is at least higher than VTN level when the diode is fully turned on and in latching state with the feedback loop, but VGS level is only slightly changed when the current is changed more because the curve is very steep above the threshold voltage of NMOS transistor. The I-V curve of base-emitter of p-n-p Q1 is shown in FIG. 4D, wherein built-in voltage (or threshold voltage) of p-n-p Q1 transistor is VFP, and the applied voltage of the transistor is VBE, where VBE level is determined by the current flow including pull-down NMOS transistor, p-n-p-n diode and pull-up PMOS transistor. Thus, VBE level is at least higher than VFP level, but VBE level is only slightly changed when the current is changed more because the curve is very steep above the built-in voltage of p-n-p Q1 transistor. In FIG. 4E, I-V curve of pull-up PMOS 420 is shown, wherein the applied voltage of pull-up PMOS is determined by subtracting the word line voltage VWL from VP level of supply voltage, which curve is less steep, thus the applied voltage of pull-up PMOS is varied by the word line voltage. The applied voltage of pull-up PMOS is VP-VWL as shown in FIG. 4E.

The bit line voltage is near VGS level if the bit line resistance is ignorable, and the collector-emitter voltage VCE of n-p-n Q2 is relatively low because collector current is much higher that base current when the bipolar transistor is turned on in nature. Hence, VCE level is lower, which is ignorable. In this respect, the storage node voltage (VGE) is very close to VGS level, when the stored data is "1", where VGE=VGS+VCE, and VGE=VWL−VBE as shown in FIG. 4B.

By asserting the word line 401, the memory cell 400B and 400D are turned on because the forward bias is set up from the word line 401 to the storage nodes, where the storage node 403B and 403D are lower than VWL level. After the storage node was written at VGE level, its charges are leaked by the reverse bias leakage through the emitter which is connected to the word line 401 at VL level during standby, which helps to read data "0" by establishing the stronger forward bias for the next read cycle.

Figure 5A:
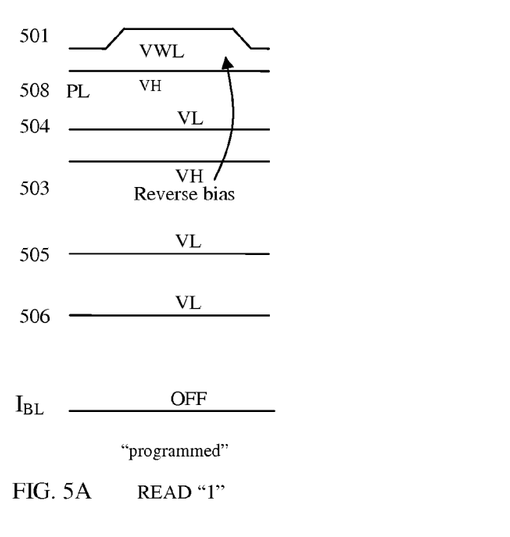
FIG. 5A illustrates a timing diagram of read "1" operation, according to the teachings of the present invention.

Referring now to FIG. 5A in view of FIG. 4A, timing diagram for read "1" operation is illustrated. The word line 501 is asserted to start read cycle, where the plate line (PL) 508 keeps constant voltage at VH level. Unlike read "0", when the word line 501 is raised, the forward bias is not established between the storage node 503 and the word line 501, because the storage node 503 is near VH level. Hence, reverse bias is set up. As a result, there is no current path (IBL). Read "1" does not consume current from the word line 501 to the bit line 506, which helps to save active power. After read data, the voltage of storage node is not changed, thus read operation is nondestructive.

Figure 5B:
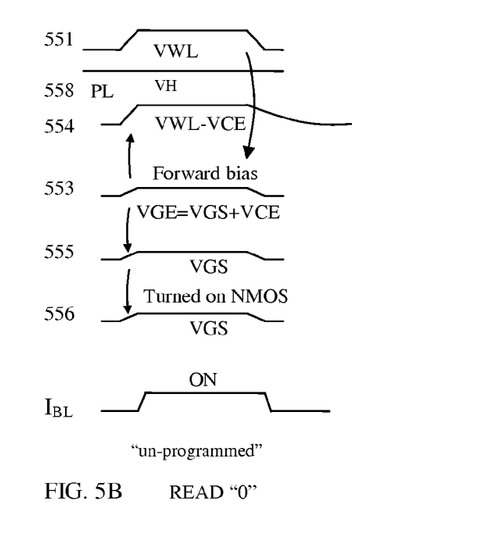
FIG. 5B illustrates a timing diagram of read "0" operation, according to the teachings of the present invention.

Referring now to FIG. 5B in view of FIG. 2A, timing diagram for read "0" operation is illustrated. In order to start read cycle, the word line 551 is asserted, where the plate line (PL) 558 keeps constant voltage. Thus, the word line voltage is reached to VWL level. When the stored data is "0", the storage node 553 is around VGE level, or lower than VGE level during standby. Thus the forward bias is established by asserting the word line 551. And then, the base 554 of n-p-n Q2 in FIG. 2A (also collector 554 of p-n-p Q1 in FIG. 2A) is raised by turning on p-n-p Q1 in FIG. 2A. At the same time, n-p-n Q2 is turned on, which raises the emitter 555 and the bit line 556. When the bit line 556 is reached to threshold voltage (VTN) of NMOS, pull-down NMOS is turned on. The bit line current (IBL) is appeared during the word line is asserted.

Figure 6:
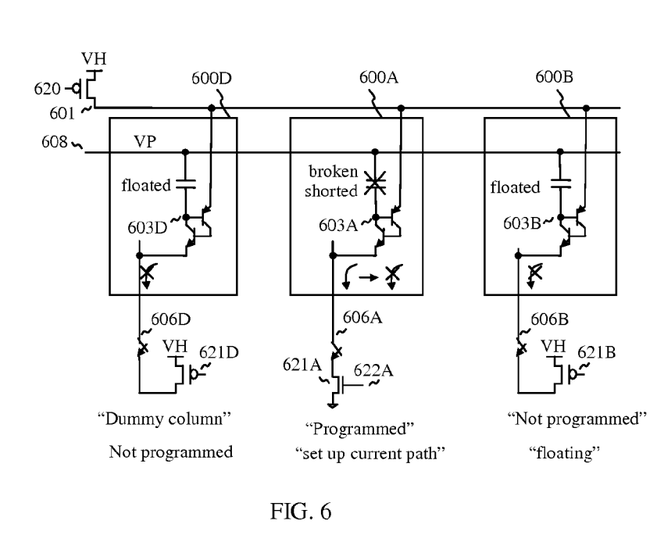
FIG. 6 illustrates the schematic for write (program) operation, according to the teachings of the present invention.

In FIG. 6, write (program) operation is illustrated, as the present invention. In order to write data, the bit lines are set up the write voltage before the word line 601 is asserted by lowering the row decoder output 620 to ground level. In this manner, the (programmed) cell 600A is turned on because the bit line is asserted to VL level. But un-programmed cells 600B and 600D are not turned on because the bit lines 606B and 606D are raised to VH level which sets up reverse bias toward the word line, where the cell 600D is a dummy cell which is to limit the word line voltage during read operation, thus there is no need to program the dummy cell. And the un-programmed cell 600B is a cell to keep data "0" in this example.

In order to program the cell 600A to data "1", the word line voltage is asserted by lowering the row decoder output 620. But the word line voltage is limited around VFP level because the bit line keeps ground level when programmed. And also the storage node is close to the bit line voltage, near ground level. After then, the plate line is asserted to VP level in order to breakdown the oxide of the cell 600A. In doing so, the applied voltage of the capacitor in the cell 600A is around VP level. In order to breakdown the oxide of the capacitor, VP level is carefully determined, such that thin oxide is easily broken at low voltage and thick oxide is broken at high voltage. One of preferred voltage to program is the high voltage of interface circuit which is generally higher than that of internal circuit. For instance, the interface voltage is 2.5V while the internal circuit uses 1.2V. When 2.5V voltage is applied to the oxide, the oxide will be broken when the thickness is near the same as the internal oxide. After broken, the storage node 603A is shorted to the plate line at VP level, which means that the base of the diode is reverse biased. In consequence, the diode is turned off after broken, which prevents a high current path after programmed. And also the voltage of plate line can be determined more flexibly, because the plate line voltage does not affect the other nodes with high voltage, during program. This is one of major advantages of the present invention. And also the diode area is small with low cost process.

While the cell 600A is programmed, un-programmed cells 600B and 600D are not activated such that the storage nodes 603B and 603D are floating, by raising the bit lines 606B and 606D to VH level. Thus the storage nodes are coupled to the plate line 608 when the plate line is asserted to VP level, and also the voltage of the storage nodes are raised to the voltage of the plate line by the coupling. As a result, the base (storage node) of the diode is strongly reverse biased. However, the reverse biased diode is not easily broken, and the breakdown voltage of the diode is relatively higher than the oxide breakdown. In this manner, the oxide of the un-programmed cell is not broken.

Figures 7A, 7B, 7C, 7D:
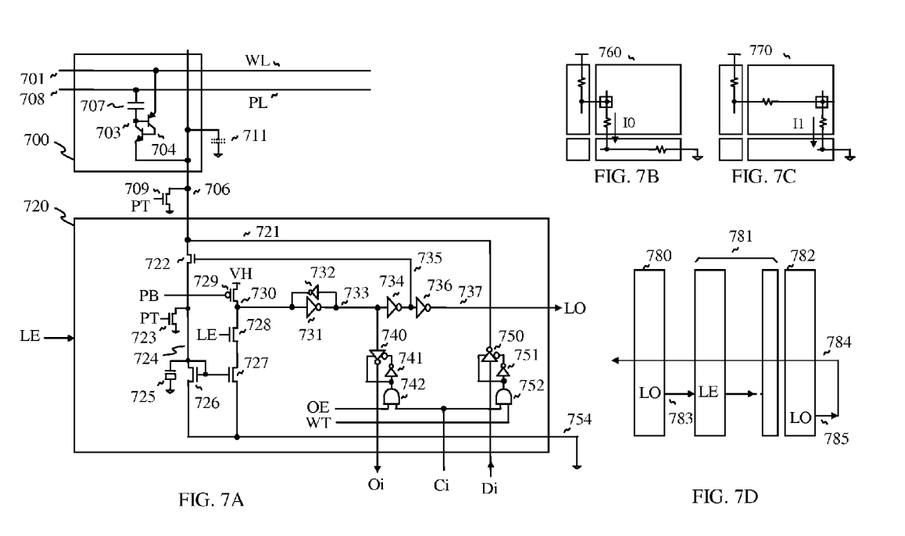
FIG. 7A illustrates read-write circuit and memory cell, according to the teachings of the present invention.
FIGS. 7B and 7C illustrate the current path of the example array.
FIG. 7D illustrates an example array including the dummy columns and the main columns, according to the teachings of the present invention.

In FIG. 7A, a detailed read-write circuit to access the one-time programmable memory is illustrated, as the present invention, wherein the memory cell 700 is connected to the read-write circuit 720. In order to write (program) the memory cell 700, the insulator of the capacitor 707 is broken when the storage node 703 is lowered by turning on the diode when the word line 701 is asserted, and then the plate line 708 is asserted to high voltage, where the bit line 706 is connected to the node 721. And the node 721 is near ground level by turning on the clocked inverter 750. During write, write enable (WT) signal is asserted to high, and column decoder output (Ci) is also asserted to high. Thus, the clocked inverter 750 is turned on by the AND gate 752 and inverter 751. When data input (Di) is asserted to high, the bit line voltage (also output 721 of clocked inverter 750) keeps low. Otherwise, the bit line 706 is raised to high in order not to program, such that the storage node 703 is coupled by the plate line when it is rising. Thus, the insulator of the capacitor 707 is not broken during floating.

When reading the stored data from the memory cell 700, the word line 701 is asserted from ground level to VWL level (as shown in FIG. 3B), while the plate line 708 is at VH level, and the bit line 706 is floating but the voltage of the bit line 706 is pre-charged at ground level. By raising the word line 701, the storage node 703 is reverse biased when the insulator of the capacitor is broken and shorted to the plate line at VH level. The storage node voltage at VH level is higher than the word line voltage at VWL level. As a result, the diode is still turned off, and no current path is set up. Hence the latch node 730 keeps the pre-charged voltage (VH level) and the output (Oi) is high when the clocked inverter 740 is enabled by the inverter 741 and AND gate 742. However, when the storage capacitor is not broken (un-programmed), the storage node is discharged near ground level by the reverse bias leakage. Thus, the storage node 703 sets up forward bias, when the word line 701 is asserted. By the forward bias, the p-n-p transistor is turned on, and the floating node 704 is raised. By raising the floating node 704 which is the base of n-p-n transistor, the n-p-n transistor is turned on. When the diode sets up a current path, the bit line 706 is raised by the current path. And when the bit line is reached to VTN (threshold voltage of the NMOS transistor 726) level, the NMOS transistor 726 is turned on, where the feedback switch 722 is turned by the latch node 730 at VH level, but the other precharge and write related circuits are turned off, during read, such that NMOS transistor 709 and 723 are turned off, PMOS transistor 729 is turned off, latch enable (LE) signal is low and write enable (WT) signal is low. In the read operation, the threshold voltage of the current mirror 726 and 727 is sensitive to set up the current path. Hence, low threshold transistor can be used as the current mirror in order to achieve fast read, alternatively.

Unlike MOS access device, the diode access device faces serious data pattern sensitivity when multiple memory cells are connected to a word line. For example, when all the stored data are "0", all the memory cells on the word line are turned on, which causes severe voltage drop. Single word line may not provide enough current for all the memory cells, when the segmented memory array is big for the high density memory configuration. This means that the diode-based capacitor memory needs more row decoders and more segmentation than those of the conventional MOS transistor-based memory, in order to avoid the data pattern sensitivity. Alternatively, a circuit technique is introduced to reduce the number of row decoder for the diode-based memory. Thus, single row decoder drives many memory cells with sequential switching, such that "self-closing data latch" is used, wherein the current mirror repeats the amount of current that the memory cell flows, when the stored data is "0", and after latching data "0", the current path is self-closed by the latch output, while the stored data "1" (programmed) does not flow current and it does not affect the voltage drop. At a certain time period, the limited numbers of memory cell are turned on by using self-closing data latch, and it depends on various conditions, such as process, voltage, temperature, layout and array size. For example, 5 memory cells are turned on at high voltage and fast process. After 5 memory cells in the near side of the word line driver are turned on, those memory cells are self-closed, and then next 5 cells are turned on because the word line voltage is raised after near side 5 cells are turned off. At this time, the voltage of far side of the word line is lower than that of near side because the word line starts to rise from the near side. In contrast, at low voltage and slow process, 10 memory cells are turned on, for example, because the feedback loop is slow.

During read operation, coupling noise is generated by the adjacent column, because the un-programmed cells are turned on, thus the bit lines are raised. But the programmed cells are not turned on, which means that the bit lines of the programmed cell are floating and keeps the pre-charged voltage at ground level during read. When the bit lines of the un-programmed cells are rising, the bit line of the programmed cell is coupled, where the bit lines are adjacent and in parallel in the array. In order to reject the possible sensing error induced by the coupling noise. In order to suppress the coupling noise when reading, there are 3 features to reject or reduce the coupling noise. First feature is that the ratio between the feedback inverter 732 and the current mirror 727 can be optimized, such that the bit line is coupled by the adjacent bit lines which stores data "0", but the latch node 730 is not flipped because the feedback inverter 732 will reject the change with coupling-based weak current. In order to reject the coupling noise, the ratio between the pull-up device of the inverter 732 and the current mirror 727 including NMOS transistor 728 should be optimized depending the conditions, such as process, operating voltage, layout and so on. Second feature is that the MOS gate capacitor 725 is used as a noise filter, such that the gate of current mirror 727 is slowly changed by the capacitor. In doing so, the coupling noise will be reduced. The capacitance value is not bigger than parasitic capacitance 711 of the bit line. Third feature to suppress the coupling noise is that the latch enable (LE) signal is turned on after the nearest dummy column is turned on (as shown in FIG. 4A), which enables to measure the current mirror after the bit line is stable, while LE signal of the dummy column is always fixed at VH level to detect the completion of the current path.

In addition, total resistance of the current path is equally distributed regardless of the location of the memory cell in physical connection. As shown in FIG. 7B, the current path for each memory cell is equal in resistance where the ground line is reversely distributed toward the word line. In this manner, total resistance for each cell is equal or similar, such that when the near side memory cell is turned on, the current path I0 in 760 (in FIG. 7B) is set up, and when the far side memory cell is turned on, the current path I1 in 770 (in FIG. 7C) is set up. And those current paths include multiple memory cells.

In FIG. 7D, an example array configuration is illustrated, wherein a dummy column 780 is located in left side, main columns 781 are located in the center, and another dummy column 782 is placed in the end of column. When read, near side dummy column 780 generates latch output 783 (LO). LO signal 783 becomes latch enable (LE) in the main columns and end of dummy column 782. Thus, the main columns are enabled after the dummy column 780 is activated, which means that the main bit lines are stable with no coupling when read. And end of dummy column 782 generates also LO signal 785. Hence, LO signal 785 becomes a signal 784 in order to return to the row decoder (not shown). The signal 784 can be used to complete the read cycle, such that the block will be disabled by the signal 784. In the present invention, the detailed control circuits are not illustrated in order to avoid unnecessary complexity because the control circuits can be configured with the conventional circuit techniques.

Methods of Fabrication

Replacing MOS access device with a diode access device, the memory cell needs only a p-n-p-n diode (or n-p-n-p diode) and a storage element, which realizes stacked type of memory cell structure, in order to reduce chip area. This also realizes fast access time with shorter routing delay. The steps in the process flow should be compatible with the current CMOS manufacturing environment, which are reported as the prior arts, such as U.S. Pat. No. 6,104,045, U.S. Pat. No. 6,229,161, U.S. Pat. No. 6,940,761, and U.S. Pat. No. 6,943,083. In this respect, there is no need of describing too much detailed process flow to form the memory cell, such as width, length, thickness, temperature, forming method or any other material related data. Instead of describing those details, the present invention focuses on illustrating the new memory cell structures which are practical and mass producible.

The invented one-time programmable memory cell has a capacitor and a diode, which is simple to fabricate on the wafer, as long as the reverse bias leakage and the oxide leakage are controllable. In the present invention, the memory cell is formed in between the routing layers, thus there is no relation to the bulk or substrate. Furthermore, the memory cell is formed after the MOS transistors are fabricated. In this manner, the memory cell process is independent of the MOS transistor process. Hence, topping the memory cells with low temperature can be available with amorphous silicon or polysilicon.

In order to form the diode on the metal routing layer or MOS transistor, LTPS (Low Temperature Polysilicon) can be used to form the diode, as published, U.S. Pat. No. 5,395,804, U.S. Pat. No. 6,852,577 and U.S. Pat. No. 6,951,793. LTPS has been developed for the low temperature process (around 500 Celsius) on the glass in order to apply the display panel, according to the prior arts. Now the LTPS can be used as a diode for the memory access device. Generally, polysilicon diode can flow less current than single crystal silicon diode, but the polysilicon diode can flow more current than MOS transistor, because the diode can flow the current through the whole junction while the MOS transistor can flow the current through the shallow inversion layer by the gate control. In the present invention, LTPS-based diode is useful to stack the diode-based memory cells with no very thin oxide layer, because the memory cell does not include MOS transistor. The insulator for the capacitor may be thicker than that of MOS transistor in the control circuits. During polysilicon and capacitor process, the MOS transistor in the control circuit and routing metal are less degraded.

Figure 8A:
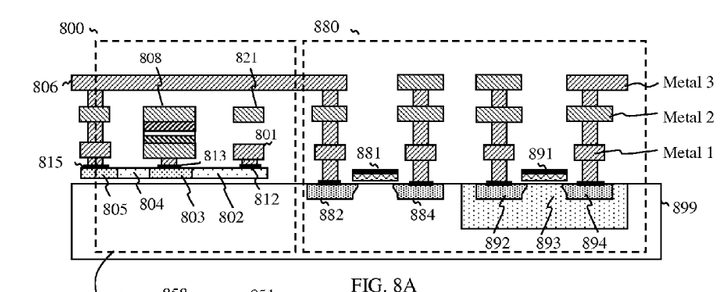
FIG. 8A illustrates the cross sectional view of the memory which is formed in between the routing layers on the wafer as an example embodiment, according to the teachings of the present invention, where
Figure 8B:
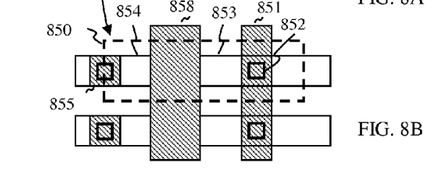
FIG. 8B is top view of memory cell area of FIG. 8A.

In FIG. 8A, an example cell structure for the one-time programmable memory cell, is illustrated, such that the one-time programmable memory cell 800 is formed on the bulk wafer 899, wherein the word line 801 is connected to p-type anode 802 through ohmic contact region 812 including conduction layer, p-type anode 802 is attached to n-type storage node 803, the storage node 803 is attached to p-type floating node 804, the floating node 804 is attached to n-type cathode 805, n-type cathode 805 is connected to the bit line 806 through contact region 815 including conduction layers, where the capacitor is formed in between the buffer layer on the plate line 808 and buffer layer on the storage node 803. The advantage of this cell structure is that the memory cell 800 is formed on the wafer, such that p-n-p-n diode is formed between the metal 1 and the substrate, and the capacitor is formed between the metal 2 and metal 1, which process flow is still compatible with the conventional CMOS process with additional steps, where the peripheral circuits are connected to the bit line 806, such that NMOS transistor is consisted of gate 881, n-type drain/source 882/884 on the substrate 899, and PMOS transistor is consisted of gate 891, p-type drain/source 892/894 on the well region 893. And metal 3 is used as the bit line 806. In FIG. 8B, the top view of the memory cell 850 is illustrated, wherein p-type anode 852 is connected to the bit line 851, and p-type anode 852 is attached to the storage node 853, the storage node 853 is attached to floating node 854, the floating node 854 is attached to n-type cathode 855, and the plate line is 858.

Figure 9A:
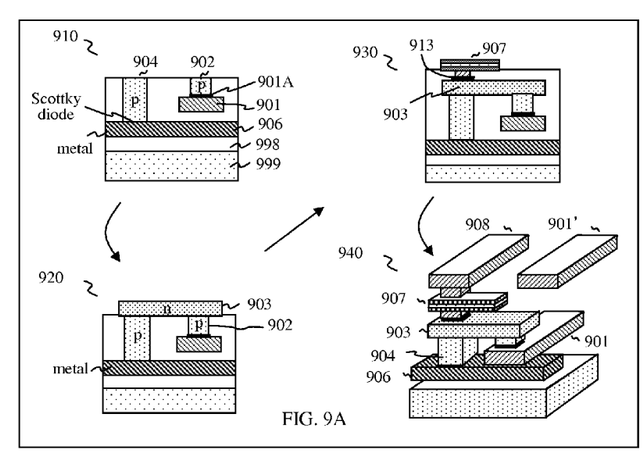
FIG. 9A to 9C illustrate a process flow to form one-time programmable memory, according to the teachings of the present invention.

In FIG. 9A, brief process steps to form one-time programmable memory on the routing layer are illustrated, as the present invention. As shown in the structure 910, the metal bit line 906 is formed after adding the isolation layer 998 on the wafer 999, and then the metal word line 901 is formed. After then, the p-type third terminal 904 is formed and makes Schottky diode with the metal bit line 906. And then, p-type first terminal 902 is formed on the silicide 901A which forms an ohmic contact to reduce contact resistance. After then, n-type region 903 is deposited as shown in the structure 920. As a result, p-n-p-n diode is formed on the metal bit line and the metal word line. After forming the diode, the capacitor 907 is formed on the contact region 913 which is connected to the second terminal 903, as shown in the structure 930, wherein the capacitor 907 may include single or multiple dielectric layers in order to form a capacitor, and various materials can be used as electrode with buffer layer. In consequence, the structure 940 is completed, wherein the plate line 908 is formed on the capacitor 907 and a passing line 901' is formed. The passing line 901' can be used as a global word line or a global plate line.

Figure 9B:
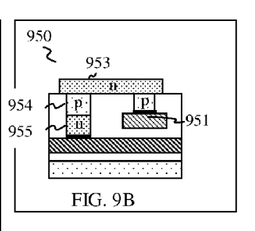
Figure 9C:
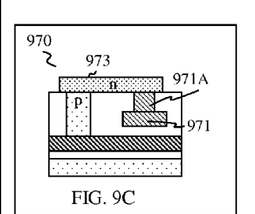

In FIG. 9B, an alternative cell structure 950 is illustrated, as the present invention, wherein Schottky diode is removed by adding n-type region 955 on the metal bit line with ohmic contact, which can be formed before forming the metal word line 951. Alternatively, as shown 970 in FIG. 9C, more cell structures are illustrated, wherein the plug region 971A can be metal plug and forms another Schottky diode with the second terminal 973.

Figure 10:
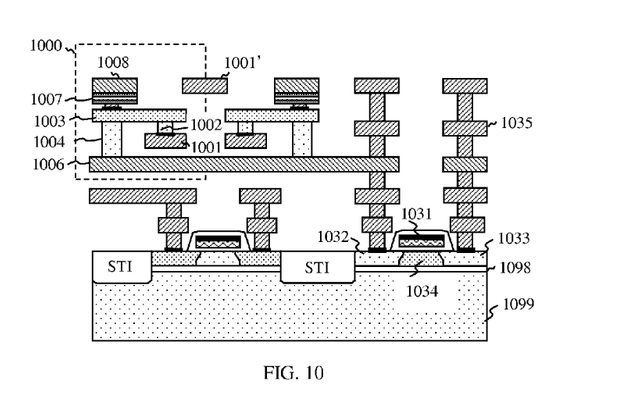
FIG. 10 illustrates a cross sectional view of one-time programmable memory on the MOS transistor, according to the teachings of the present invention.

In FIG. 10, an example cell structure on the MOS transistor is illustrated, as the present invention, wherein the metal bit line 1006 is formed after forming MOS transistor on the SOI wafer, the bit line 1006 is connected to the drain 1032 of MOS transistor, and the gate 1031 including silicide layer controls the drain 1006 and the source 1033, for example, where the body 1034 is isolated from the substrate 1099 by the buried oxide 1098, and the drain 1032 is also isolated by the STI (Shallow Trench Isolation) region. In order to form the memory cell between the routing layers, the routing layer (the word line 1001) is formed after forming the bit line 1006. After then the routing layer 1035 is formed. And p-type region (third terminal) 1004 is vertically formed after forming routing layer 1035, which becomes Schottky diode, and then another p-type region (first terminal) 1002 is vertically formed with silicide layer to make ohmic contact. And n-type (second terminal) 1003 is formed after completing the first terminal 1002. Then capacitor 1007 is formed. In this manner, the memory cells are formed in between the routing layer.

Figure 11:
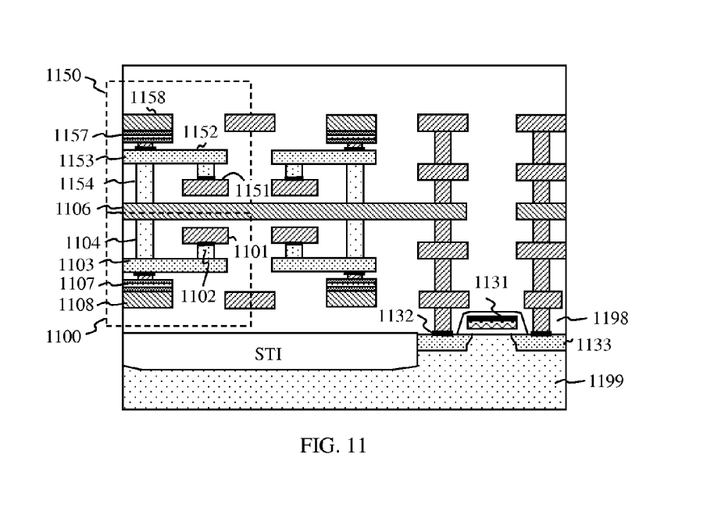
FIG. 11 illustrates a cross sectional view, wherein two cells are stacked on the wafer, according to the teachings of the present invention.

In FIG. 11, stacked memory cells on the bulk are illustrated, as the present invention, wherein the plate 1108 in the lower memory cell 1100 is isolated from the bulk 1199 (by the isolation layer 1198), the capacitor 1107 is formed on the plate line 1108, the second terminal 1103 is connected to the capacitor 1107 and connected to the third terminal 1104, the second terminal 1103 is also attached to the first terminal 1102, the first terminal 1102 is connected to the word line 1101 with ohmic contact, and the third terminal 1104 is vertically attached to the metal bit line 1106 and forms Schottky diode. The upper memory cell 1150 is formed and mirrored on the lower memory cell, wherein the third terminal 1154 is vertically attached to the metal bit line 1106 and forms Schottky diode, the third terminal 1154 is vertically attached to the second terminal 1153, the second terminal 1153 is vertically attached to the first terminal 1151 and the capacitor 1157, and the plate line 1158 is connected to the capacitor 1157. The bit line 1106 is shared with the lower cell 1100 and the upper cell 1150.

Figure 12:
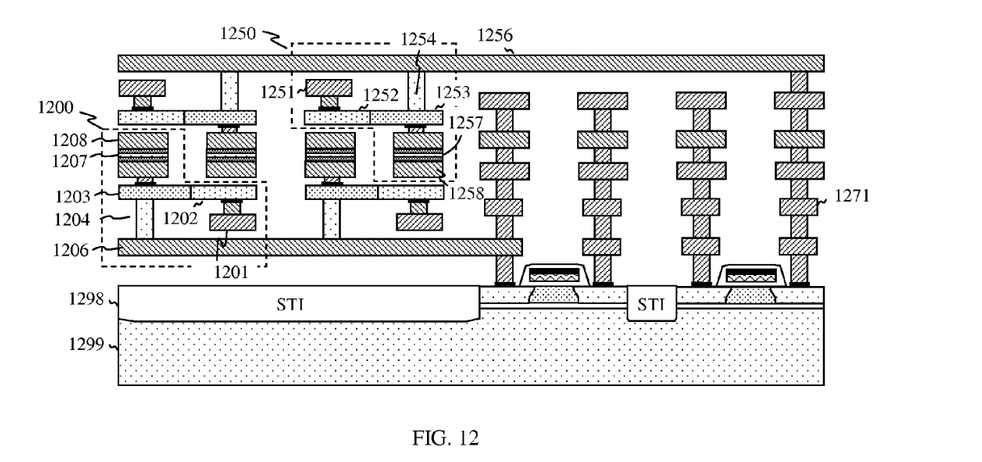
FIG. 12 illustrates a cross sectional view wherein the bit lines are separated to reduce parasitic capacitor, according to the teachings of the present invention.

In FIG. 12, another stacked memory cell on the SOI wafer is illustrated, as the present invention, wherein the capacitor is formed at one time, thus the capacitor forming step is reduced. The lower cell 1200 is configured, such that the bit line 1206 is formed on the wafer after forming MOS transistor, and then the word line 1201 is formed, after then the routing layer 1271 is formed. After then, the p-type third terminal 1204 is plugged to the metal bit line 1206 and forms Schottky diode, and then the first terminal (p-type region) 1202 is formed on the word line 1201 with ohmic contact. After then, the n-type second terminal 1203 is deposited, and then, p-type first terminal 1202 is implanted by the p-type ions. In doing so, the second terminal 1203 has no coupling region to the plate line of the upper memory cell, which is important to isolate the second terminal 1203 from the coupling, because the second terminal serves as a storage node which is charged to store data. The capacitor 1207 is formed on the second terminal 1203. And the plate line 1208 is formed on the capacitor 1207. The upper memory cell 1250 is formed reverse order, wherein the capacitor 1857 is vertically formed on the plate line 1258, the second terminal 1253 is vertically attached to the capacitor 1857, the word line 1251 is vertically connected to the first terminal 1252, the first terminal 1252 is vertically attached to the second terminal 1253, the third terminal 1254 is vertically attached to the second terminal 1253, and the bit line 1256 is attached to the third terminal 1254 with Schottky diode. In this structure, the capacitor process is reduced and the bit lines are separately connected, thus parasitic capacitance of the bit line is reduced, which achieves fast switching of the bit line. As a result, high-speed operation is realized. And also high-density memory is realized with the stacked structure.

While the description here has been given for configuring the memory circuit and array, alternative embodiments would work equally well with reverse connection, wherein n-p-n-p diode serves as an access device, the first terminal is n-type and connected to the word line, the second terminal is p-type and connected to the storage node, the third terminal is n-type and floating, and the fourth terminal is p-type and connected to the bit line. Signal polarities are reversed as well, wherein active high signal works as active low signal for the reverse configuration, and supply voltage of the word line is lower that that of the bit line while supply voltage of the word line is higher that that of the bit line when p-n-p-n diode serves as an access device as explained above. PMOS pull-up transistor is connected to the bit line through switches, where low threshold PMOS is used for the current mirror to latch the stored data in the alternative embodiment.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:

memory cell, wherein includes a diode as an access device and a capacitor as a storage device; and the diode includes four terminals, wherein the first terminal is connected to a word line, the second terminal is connected to one plate of the capacitor, the third terminal is floating, and the fourth terminal is connected to a bit line; and the capacitor includes two plates, wherein one plate of the capacitor serves as a storage node which is connected to the second terminal of the diode, and another plate of the capacitor is connected to a plate line; and the plate line is asserted to programming voltage which is higher than the regular supply voltage of the decoders and data latches, in order to breakdown the insulator of the capacitor when programming, but the plate line is connected to the regular supply voltage when read;

memory cell array, wherein includes decoders, data latches, main memory cells and dummy memory cells; and main memory cells configure main columns, dummy memory cells configure dummy column(s), dummy column(s) generates delayed signal based on the dummy cells to enable the main columns in order to start latching the stored data from the memory cell; and data latch, wherein includes current mirror and latch circuit, the current mirror is connected to the diode through the bit line, and the latch circuit is connected to the current mirror, and the latch circuit cuts off the current path of the bit line after latching data from the memory cell, when read.

2. The memory device of claim 1, wherein the diode includes four terminals, the first terminal is p-type, the second terminal is n-type, the third terminal is p-type, and the fourth terminal is n-type.

3. The memory device of claim 1, wherein at least one terminal of the diode includes metal to form Schottky diode.

4. The memory device of claim 1, wherein the diode is formed from silicon including polysilicon, amorphous silicon, and stretchable silicon.

5. The memory device of claim 1, wherein the diode is formed from germanium.

6. The memory device of claim 1, wherein the diode is formed from compound semiconductor.

7. The memory device of claim 1, wherein at least one terminal of the diode is vertically formed on the other terminal of the diode.

8. The memory device of claim 1, wherein the memory cells are formed (stacked over) on the MOS transistor.

9. The memory device of claim 1, wherein the memory cells are formed on the bulk wafer.

10. The memory device of claim 1, wherein the memory cells are formed on the SOI wafer.

11. The memory device of claim 1, wherein two memory cells are stacked on the wafer.

12. The memory device of claim 1, wherein the current mirror in the data latch includes lower threshold NMOS transistor than that of control circuit in the chip.

13. The memory device of claim 1, wherein the memory cell is implemented an alternative embodiment with reverse configuration; and the diode, wherein includes four terminals, the first terminal is n-type and serves as a word line, the second terminal is p-type and serves as a storage node, the third terminal is n-type and floating, and the fourth terminal is p-type and serves as a bit line; and the plate line is asserted to lower voltage than ground level, when programmed; and data latch, wherein includes current mirror and latch circuit, the current mirror is connected to the diode through the bit line, and the latch circuit is connected to the current mirror, and the latch circuit cuts off the current path of the bit line after latching data from the memory cell, when read.

14. The memory device of claim 13, wherein the current mirror in the data latch includes lower threshold PMOS transistor than that of control circuit in the chip.

* * * * *